United States Patent [19]

Yi

[11] Patent Number: 5,200,720
[45] Date of Patent: Apr. 6, 1993

[54] EMI BEAD CORE FILTER, PROCESS AND APPARATUS THEREOF

[75] Inventor: Hyung J. Yi, Anyang, Rep. of Korea

[73] Assignee: Sam HWA Capacitor Co., Ltd., Kyunggi, Rep. of Korea

[21] Appl. No.: 750,933

[22] Filed: Aug. 28, 1991

[30] Foreign Application Priority Data

Nov. 27, 1990 [KR] Rep. of Korea ............. 19258

[51] Int. Cl.$^5$ .................................. H03H 7/01
[52] U.S. Cl. .................................. 333/181; 333/12; 336/175
[58] Field of Search ............. 333/12, 181–185; 336/233, 221, 205, 96, 175

[56] References Cited

U.S. PATENT DOCUMENTS

| | | | |
|---|---|---|---|
| 4,370,698 | 1/1983 | Sasaki | 361/330 |
| 4,486,641 | 12/1984 | Ruffini | 336/177 X |
| 4,656,451 | 4/1987 | Pomponio | 333/12 X |
| 4,797,647 | 1/1989 | Okubo et al. | 333/12 X |
| 5,034,710 | 7/1991 | Kawaguchi | 333/185 |

FOREIGN PATENT DOCUMENTS 0275093 7/1988 European Pat. Off. .
0276684 8/1988 European Pat. Off. .
2-2514 1/1990 Japan .

*Primary Examiner*—Paul M. Dzierzynski
*Assistant Examiner*—Seung Ham
*Attorney, Agent, or Firm*—Jacobson, Price, Holman & Stern

[57] ABSTRACT

An EMI bead core filter is used to suppress or reduce a noise by utilitizing the characteristics of increasing the impedance in high frequency, which comprises of a ferrite core, a lead wire and a coating layer. The coating layer deposited on the upper portion of the core and the bending of the wire to adhere between the core and the wire by coating with an epoxy powder. A process of this invention comprises of the steps of bending, inserting, tapping, heating, coating, packaging and hardening, and especially the coating is accomplished by carrying repeatedly out four times, that is, upon preheating at 380° C. and heating at 335° to 340° C. A coating apparatus has a vacuum device, a powder chamber and two heaters. The filter has a high impedance and a small size.

3 Claims, 6 Drawing Sheets

EMI BEAD CORE FILTER, PROCESS AND APPARATUS THEREOF

FIELD OF INVENTION

This invention relates to an EMI (electro magnetic interference) bead core filter, especially to an EMI bead core filter which is constructed to suppress or reduce a noise by utilizing the characteristics of increasing the impedance in high-frequency, a process for the preparation and an apparatus for the preparation of such noise filter.

BACKGROUND OF INVENTION

Recently, digital electronic instruments are rapidly progressed in various field together with the development of the semiconductor industrials, especially digital electronic instruments for OA (office automation), FA (factory automation), cars, CD (compact disk), DAT (digital audio tape) and video tape are more rapidly progressed.

In general, these digital electronic instruments are commonly generated an electronic noise, and the noise may cause an electro magnetic interference (EMI, it is simply called as "noise" by any person) and the EMI may make mulfunctions or effects of reducing the S/N ratio of other hearby electronic equipment or appliance through the supply line or electrical radiation.

Therefore, the like noise is recently become a social problem and it is proceeding to restrict the diffusion of the noise under the legal in the world. For examples, to restrict the noise, under the FCC (federal communication commission) of the United States of America Docket No. 20780 was issued on October, 1979 and also administerred under the CSA in Canada and the VDE in Germany.

A filter is utilized as an electronic part to protect or reduce such noise and the generally characteristics of the filter are illustrated in FIGS. 1(A), 1(B) and 1(C), wherein FIG. 1(A) shows to the one of a simple or coil filter, FIG. 1(B) shows to the one of a L-type filter and FIG. 1(C) shows to the one of $\pi$-type or T-type filter.

Hitherto, the three-terminal capacitor is usually used to protect or reduce a noise in low-frequency and the two-terminal capacitor or coil is often used to protect or reduce a noise in high-frequency. However they have shown many problems such as, for examples, occuring the residual inductance based on the lead wire and electrode structure, enlarging the suspended capacity inter wire wound, appearing the resonance point from several MHz to several tens MHz, and rapidly decreasing the effect of reducing the noise in high-frequency. Additionally, a lead through capacitor which does not occur the residual inductance in high-frequency may be applied, however it has the complexity in preparing them and increased the unit cost of production thereof. Accordingly, a lead through capacitor can be only applied to use restrictively [Refs.: E.P. Pat. Publn. Nos. 275093 and 276684, U.S. Pat. No. 4,370,698 and K.R. Pat. Publn. No. 90-2514 etc.]

Recently, it does not described in the literatures but a filter is practically made of combination of ferrite core and lead wire. Bead cores are often used as a component for a counter-noise for preventing EMI (electro magnetic interference). In the cases, ferrite cores having a small eddy current loss and a high magmetic permeability are also used, because ferrite cores are very cheap and it can be made a noise filter having a relatively structure and few side effects such as, distorted signals and extraordinary oscillation. These known filters consisted of ferrite core and lead wire are illustrated in FIGS. 2(A) to 2(D). A filter illustrated in FIG. 2(A) is an axial type one and filters illustrated in FIGS. 2(B), 2(C) and 2(D) are radial type one. As shown in FIGS. 3(A) and 3(C), to bond a ferrite core (201) and a lead wire (202), liquid bonding agent (203) such as liquid poste or liquid starch is used at the top of the hole (204) or all the hole (204) of the core (201). However, the filter illustrated in FIG. 3(A) has a characteristic of a high impedance ($|Z|$) along with a weak mechanical strength, on the contrary, the filter illustrated in FIG. 3(B) has a characteristic of a low impedance along with a strong mechanical strength. Therefore, it desires to develop a new filter having a high impedance as well as a strong mechanical strength, by a simple process.

SUMMARY OF THE INVENTION

The EMI bead core filter of this invention consists of a ferrite core, a lead wire and a coating layer of an epoxy powder, and is prepared by bending a lead wire and inserting a bending lead wire into the hole of the ferrite core and then heating, melting and coating with epoxy powder four times at about 340° to 380° C.

An object of this invention is to provide a new EMI bead core filter having a high impedance as well as an excellant mechanical strength and having a relatively small size filter applicable automatically to the PCB (printed circuit board) by an auto-mounting machine.

Further objects of this invention is to provide a suitable process to be workable on a large scale in preparing and a coating apparatus thereof.

BRIEF DESCRIPTION OF THE DRAWINGS

FIG. 5 is a front view of prefilter before coating with epoxy powder, FIG. 6 is a front view of the prefilter and an auto-coating apparatus in coating with epoxy powder, FIG. 7 is a plan view of a heating apparatus and FIG. 8 is an enlarged front view of the prefilter to explain in detail the coating process shown in FIG. 6.

DETAILED DESCRIPTION OF THE INVENTION

This invention relates to an EMI bead core filter, especially to an EMI bead core filter which is constructed to suppress or reduce a noise by utilizing the characteristics of increasing the impedance in high-frequency, a process for the preparation and an equipment for the preparation of such noise filter.

The EMI bead core filter (hereinafter referred to as "filter") of this invention comprising a ferrite core, a lead wire and a coating layer of an epoxy powder, further details and advantages of this invention may be learned from the following detailed description in connection with the accompanying drawings.

Figure 1A:
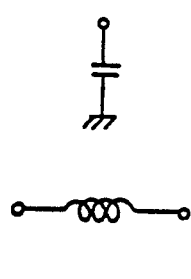
FIGS. 1(A) to 1(C) illustrate the generally characteristics of the conventional filter.
Figure 1A:
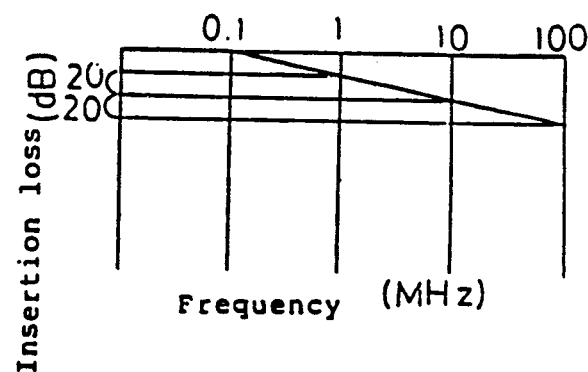
Figure 1B:
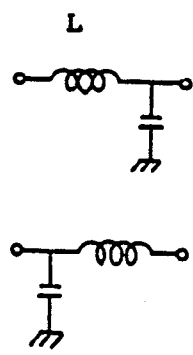
Figure 1B:
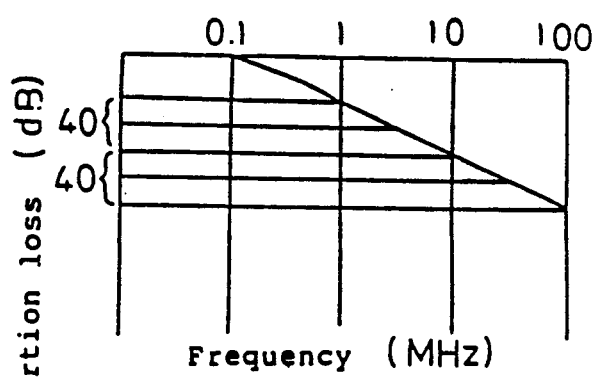
Figure 1C:
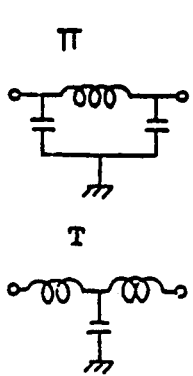
Figure 1C:
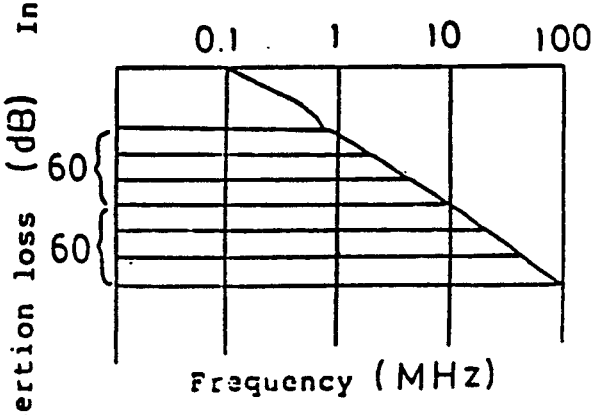
Figure 2A:
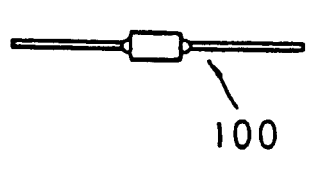
FIGS. 2(A) to 2(D) are front views of the variety embodiments of the EMI bead core filter of the prior art.
Figure 2B:
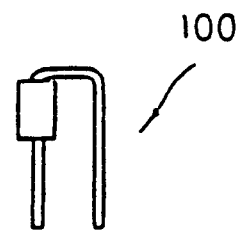
Figure 2C:
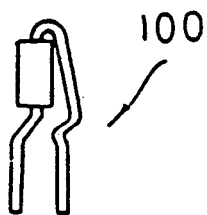
Figure 2D:
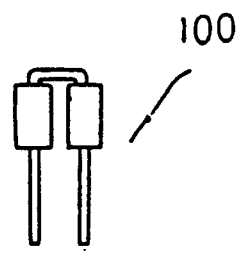
Figure 3A:
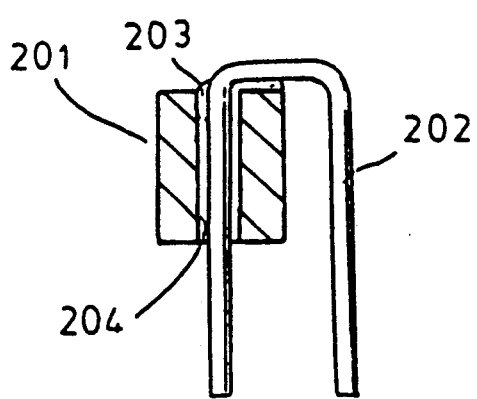
FIGS. 3(A) and 3(B) are enlarged sectional views of the variety enbodiments of the EMI bead core filter of the prior art.
Figure 3B:
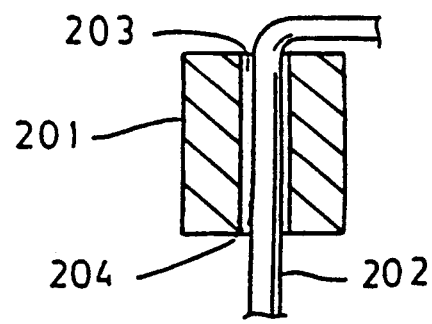
Figure 4:
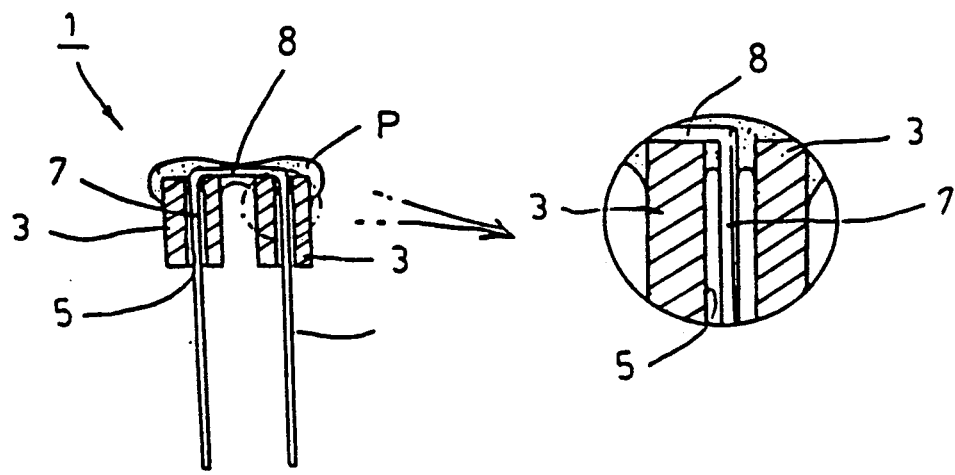
FIG. 4 is a sectional view of the EMI bead core filter of this invention.

The filter (1) of this invention was shown in FIG. 4 and the filter comprising a ferrite core (3) having a hole (5) at the center, a lead wire (7) bent by a fixed type and a coated layer with an epoxy powder resin (P; hereinafter referred to as "powder") to adhere between the core (3) with the wire (7).

The said powder (P) is used to fix and seal tightly up the upper side and the upper hole of the core (3) and the bending portion of the wire (7). The ingredients of the powder (P) consist of about 47 weight % of Aluminium (Al), 48 weight % of Silicon (Si) and 5 weight % of Cl, Ag, Sb, Ti, Fe and Co.

The coating process in carrying out this invention is a very important process belonging to a high and elaborate technology in this industrial field. The impedance of the filter depends on the coating process, it generally shown a 25% to 35% reduction of the value of the standard for the impedance ($|Z|$) according to the general bonding process. Though, the value of the standard obtains in case of having no any certain obstruction in the hole of the core (3), however it is necessary to fix the core and the wire in order to insert in the auto-mounting machine and to prevent of moving the core. Accordingly, a bonding agent such as a liquid paste or starch has been unavoidably applied in shortening the impedance ($|Z|$). A bonding agent such as liquid epoxy consisted aluminium oxide ($Al_2O_3$) as an ingredient may be also applied, but the impedance ($|Z|$) is also decreased by increasing up the magnetic resistance on the reason of the mass of Aluminium.

A process for the preparation of the filter in this invention is described in detail in the following example.

EXAMPLE

The 1st Step (forming and inserting)

This step is to insert a lead wire (7) into the hole (5) of the ferrite core (3). The step is carried out by an EMI filter auto-machine and included a series of the forming and inserting stage. The operations in these stages are almost and simultaneously carried out on the whole.

The lead wire (7) was cutted by a regular length and bent by the type of "U" substantially, then inserted into the hole (5) of the core (3) to obtain a prefilter (not adhered between lead wire and core).

The afore-mentioned EMI filter auto-machine comprises a cylindric and vertical drum for moving the core (3) in a regular intervals, an air cylinder device for inserting in sequence the core (3) into the vertical drum, a forming device for bending to form U-shaped wire and a vibration feeder for supplying the core (3).

The 2nd Step (tapping and punching)

Figure 5:
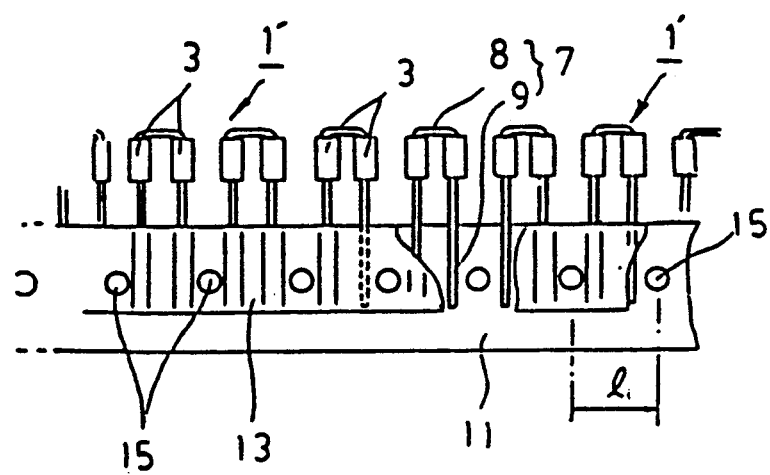
FIGS. 5 to 8 illustrate the embodiments in each step of the process of this invention.

The obtained prefilter which was simply inserted the wire (7) into the core (3), was tapped on the tape and punched to make a sproket hole in order to be applicable by an auto-mounting machine. That is, the prefilter (1') was tapped on a paper tape (11) and a thermal tape (13) as shown in FIG. 5. The adhesive portion (9) of the end of the wire (7) was fixed by the paper tape (11) and thermal tape (13). After carried out this invention, the adhesive portion (9) may become a soldering region in case of inserting actually to a PCB (printed circuit board). A tack adhesive was applied in the inner part of the thermal tape (13) and the wire (7) was adhered by complexing with the heating by a thermal adhesive machine which is able to control at about 400° C. of the heating temperature. It is desirable that the thermal tape (13) has an adhesive effect at least at 250° C. up of the temperature.

The 3rd Step (coating)

Figure 6:
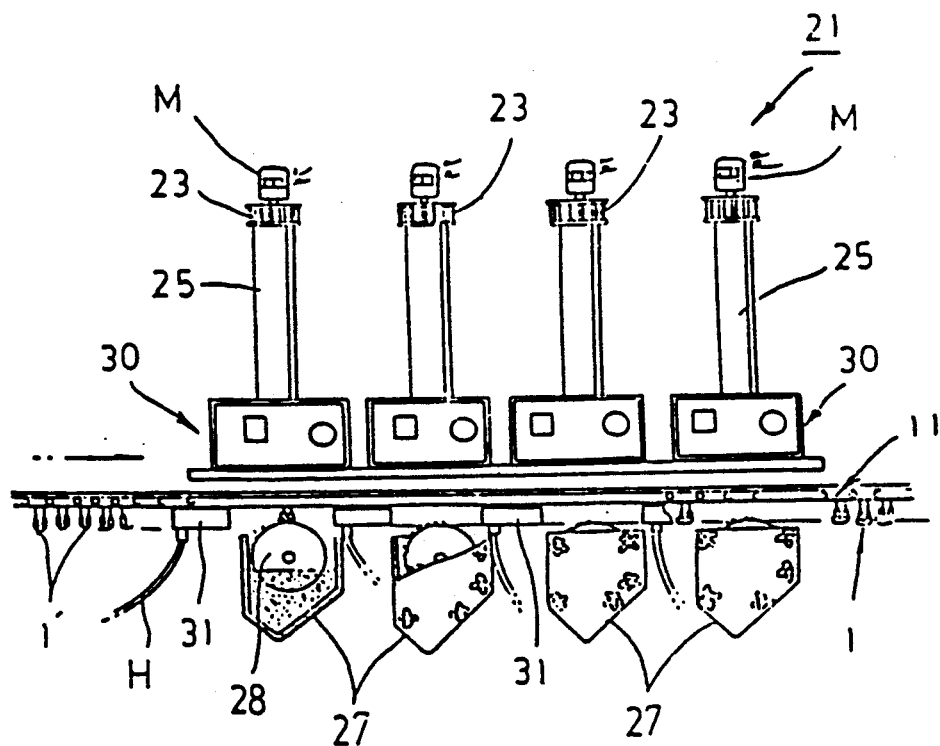

The prefilter which tapped and punched according to the 2nd step was coated with an epoxy powder (P). As shown in FIG. 6, the coating of the bending portion (8) of the wire (7) was carried out by the coating apparatus (21) during moving in the direction of the arrow, under condition of the style of standing on head of the prefilter (1').

Figure 7:
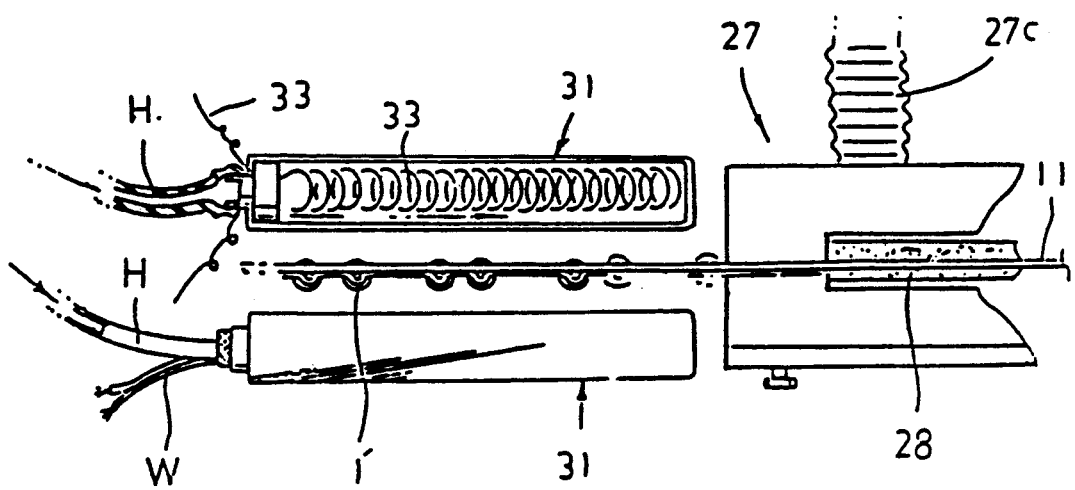

The coating apparatus (21) comprises a vacuum fan (23) operating by a motor (M) at the top of the apparatus, a series of vacuum device having a vacant column (25) connected with a powder chamber (27), an electro control box (30) and a heater having a hot wire (33). A body of rotation (28) was constructed in the inner of the powder chamber (27). In proceeding of the coating by the coating apparatus, because of the coating was carried out under condition of the style of standing on head of tapped and punched prefilter, the core (3) automatically moved round the bottom of the bending partion (8) of the wire (7) upon the weight of core (3) itself. The embodiment of the heater (31) which applied to heat the prefilter (1') is shown in FIG. 7. In FIG. 7 the mark H represents an air hose connected with an air blower (not shown) and the mark W represents a conducting wire which supplied an electric power to the hot wire (33).

The coating in this invention is accomplished by carring repeatedly out four (4) times. A paper tape (11) which adhered the prefilter (1'), was passed through a space between two heaters (31) and (31) in order to heat the core (3). The prefilter was preheated at about 380° C. of the first heating temperature and dipped into the epoxy powder (P), next heated at about 335° to 340° C. of the second, third and fourth heating temperature to melt and coated with expoxy powder (P). After heated from the hot wire (33) of the heater (31) the temperature for the preheating was controlled by the hot wind of the air. Two heaters (31),(31) have the same figure and function each other, but it is more desirable that the one of the two heaters is an opening and shutting heater.

Figure 8:
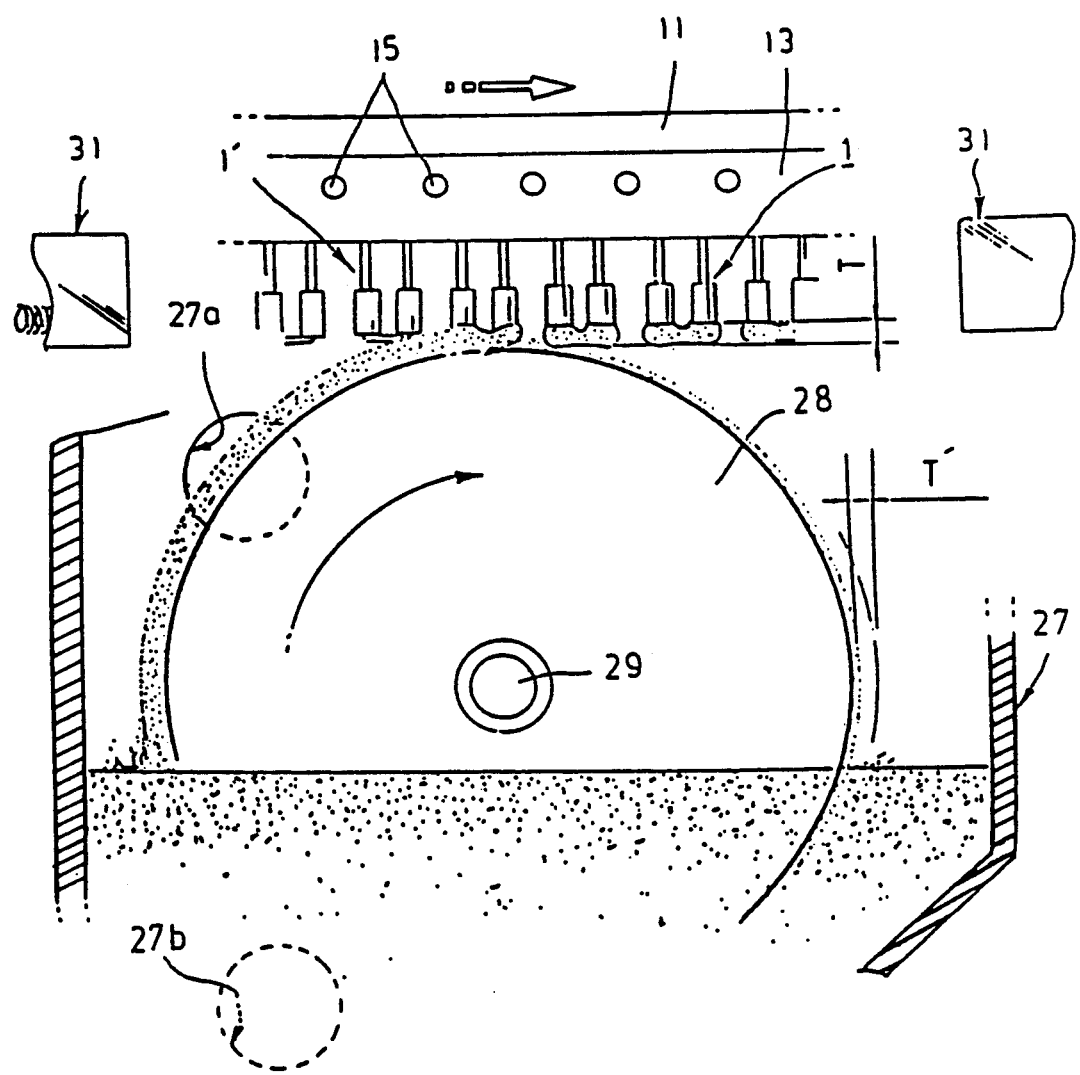

The ingredients of the epoxy powder (P) in this invention consist of 47 weight % of Al, 48 weight % of Si and the residuals of Cl, Ag, Sb, Ti, Fe and Co and the coating process more explained as the followings accompanying with the FIGS. 7 and 8. The body of rotation (28) in the inner of the powder chamber (27) was rotated on the direction of the arrow because of connecting with the axis of rotation (29) by a motor (not shown), that is, on the same direction of the moving paper tape (11).

A powder feeder (27a) and a powder out-let (27b) which connected with a vacuum hose (27C) are constructed in the rear of the powder chamber (27). The vacant column (25) is led to the inner part of the powder chamber (27) and the powder can be refluxed under vacuum in the column (25) and powder chamber (27). The heaters (31) are constructed in the number of corresponding with the number of powder chamber at the frount of the powder chamber (27), that is to say, the heaters are located at the front portion of the body of rotation (28) on setting a standand of the direction of the moving paper tape (11). The head portion of the prefilter (1') was preheated by the heater (31). The prefilter itself was heated at a lower temperature the preheating temperature because the paper tape (11) was moved into the direction of the arrow and the head of the prefilter and the ferrite core (3) were preheated by the heater (31). The heated prefilter (1') was contacted with the epoxy powder (P) on the top position of the body of rotation (28), and the head of the filter was dipped into the powder (P), then the powder (P) was melted and the head of the prefilter was coated. The afore-mentioned coating process was repeatedly carried out four (4) times by the coating apparatus to completely adhere the core (3) and the wire (7).

Figure 9:
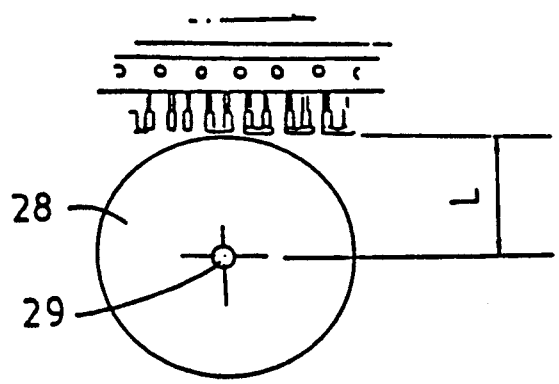
FIGS. 9 and 10 are schematic views to explain the coating conditions in coating process of this invention.

FIG. 9 is a schematic view to explain the amounts of the powder (P) for the coating. The length (L) from the center of the axis of rotation (29) in the body of rotation (28) to the end of the head of the prefilter becomes shorter in proportion to the repeated times of the coating. According to this invention the coating was carried out four times on the head of the prefilter (1') to obtain the filter (1) having a uniform coating layer.

Figure 10:
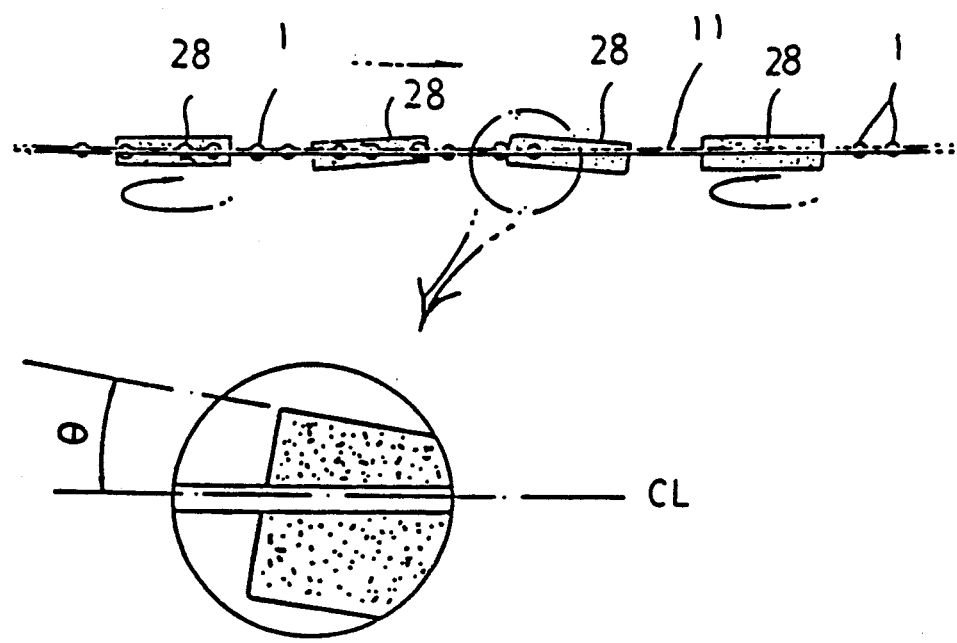

The degree of an angle ($\theta$) of the body of rotation (28) was illustrated in FIG. 10. The body of rotation (28) was constructed so as to have a slant on the center line (CL) of the paper tape (11).

The afore-mentimed length (L) and angle ($\theta$) may be changed according to the model of the filter.

The 4th Step (packaging)

After coated according to the coating step the filter (1) was taped and reel packaged to be able to apply to the auto-mounting machine. The packaging was carried out by reeling the paper tape (11) round a body of winding (not shown in FIGS.).

The 5th Step (hardening)

The packaged filter was hardened at 150° C. for 45 to 50 minutes in oven to increase the strength of the filter.

The characteristics of the filter (1) obtained according to this invention were measured by an impedance analyzer (Hewlett Packard Co., U.S.A.) and the results are descrbed in table 1.

In addition, the characteristics of the filter obtained according to the comparative example were measured by the afore-mentioned analyzer and the results are described in table 2.

TABLE 1

| | (The invention) | | |
|---|---|---|---|
| No. of test | $|Z|$ ($\Omega$) | I.R. (M$\Omega$) | Terminal strength (Kg) |
| 1 | 109.23 | 3 × 10$^4$ | 3.1 |
| 2 | 109.58 | 200 × 10$^4$ | 4.4 |
| 3 | 109.70 | 40 × 10$^4$ | 5.3 |
| 4 | 108.58 | 800 × 10$^4$ | 5.3 |
| 5 | 109.64 | 30 × 10$^4$ | 3.4 |
| 6 | 107.80 | 70 × 10$^4$ | 3.6 |
| 7 | 108.42 | 50 × 10$^4$ | 4.1 |
| 8 | 109.22 | 160 × 10$^4$ | 3.6 |
| 9 | 107.90 | 20 × 10$^4$ | 3.2 |
| 10 | 107.23 | 15 × 10$^4$ | 3.0 |
| 11 | 107.66 | 30 × 10$^4$ | 3.1 |
| 12 | 107.18 | 30 × 10$^4$ | 3.5 |
| 13 | 108.40 | 60 × 10$^4$ | 3.7 |
| 14 | 105.31 | 17 × 10$^4$ | 4.1 |
| 15 | 107.58 | 7 × 10$^4$ | 3.0 |
| 16 | 108.58 | 30 × 10$^4$ | 3.9 |
| 17 | 105.34 | 26 × 10$^4$ | 4.2 |
| 18 | 105.34 | 80 × 10$^4$ | 3.1 |
| 19 | 107.43 | 180 × 10$^4$ | 3.8 |
| 20 | 108.89 | 400 × 10$^4$ | 3.7 |
| X | 107.97 | 111.23 × 10$^4$ | 3.85 |

TABLE 1-continued

| | (The invention) | | |
|---|---|---|---|
| No. of test | $|Z|$ ($\Omega$) | I.R. (M$\Omega$) | Terminal strength (Kg) |
| S | 1.33 | 188.56 × 10$^4$ | 0.80 |
| min. | 105.34 | 26 × 10$^4$ | 3.0 |
| max. | 109.70 | 800 × 10$^4$ | 5.7 |

Remarks:
Use the epoxy powder as an adhesive agent.
The powder: 47 weight % of Al, 48 weight % of Si and 5 weight % of Cl, Ag, Sb, Ti, Fe and Co.
Analyzing: 100 Hz/20° C.
The appearance and soldering of the filter are excellent.

TABLE 2

| | (The comparative) | | |
|---|---|---|---|
| No. of test | $|Z|$ ($\Omega$) | I.R. (M$\Omega$) | Terminal strength (Kg) |
| 1 | 102.86 | 50 × 10$^4$ | 2.9 |
| 2 | 98.62 | 16 × 10$^4$ | 2.0 |
| 3 | 85.29 | 500 × 10$^4$ | 2.0 |
| 4 | 85.39 | 3,000 × 10$^4$ | 2.6 |
| 5 | 86.81 | 90 × 10$^4$ | 2.4 |
| 6 | 84.08 | 90 × 10$^4$ | 2.7 |
| 7 | 106.50 | 300 × 10$^4$ | 5.9 |
| 8 | 92.70 | 70 × 10$^4$ | 5.4 |
| 9 | 88.28 | 200 × 10$^4$ | 5.5 |
| 10 | 87.60 | 400 × 10$^4$ | 3.2 |
| 11 | 87.79 | 20 × 10$^4$ | 4.8 |
| 12 | 96.08 | 300 × 10$^4$ | 2.6 |
| 13 | 87.74 | 2 × 10$^4$ | 2.4 |
| 14 | 98.13 | 11 × 10$^4$ | 2.4 |
| 15 | 84.70 | 200 × 10$^4$ | 2.3 |
| 16 | 100.10 | 400 × 10$^4$ | 2.7 |
| 17 | 88.35 | 11 × 10$^4$ | 3.4 |
| 18 | 101.42 | 300 × 10$^4$ | 3.9 |
| 19 | 86.55 | 6 × 10$^4$ | 2.5 |
| 20 | 102.27 | 200 × 10$^4$ | 2.4 |
| X | 92.56 | 308.30 × 10$^4$ | 3.25 |
| S | 7.15 | 635.74 × 10$^4$ | 1.18 |
| min. | 84.08 | 2 × 10$^4$ | 2.0 |
| max. | 106.50 | 3,000 × 10$^4$ | 5.9 |

Remarks:
Use the liquid epoxy as an adhesive agent
The liquid: 80 weight % of Al, 8 weight % of Si and 12 weight % of Cl, Ag, Sb, Ti, Fe and Co.
Analyzing: 100 Hz/20° C.
The appearance and soldering of the filter are excellent.
The process for the preparation of the comparative example is the same with that of this invention.

As shown from the analytic data described in tables 1 and 2, $|Z|$ values of the filter (1) prepared by the process described in Example of this invention measured in 105.34 (min.) and 109.70 (max.), whereas those of the comparative example measured in 84.08 (min.) and 106.50 (max.). As the results of analyzing, it was confirmed that the filter of this invention has a higher impedance.

$|Z|$ – f values of the filter according to this invention as well as those of the comparative example were measured by an impedance analyzer (H.P. Co., Model 4194 Impedance Analyzer) and the results accompanying with the standard value are descrbied in table 3.

TABLE 3

| No. of test | The invention | The comparative | Standard |
|---|---|---|---|
| 1 | 104 | 83 | 106 |
| 2 | 106 | 88 | 107 |
| 3 | 104 | 83 | 108 |
| 4 | 105 | 85 | 108 |
| 5 | 105 | 83 | 106 |
| 6 | 105 | 81 | 106 |
| 7 | 106 | 81 | 105 |
| 8 | 105 | 87 | 106 |
| 9 | 106 | 97 | 107 |
| 10 | 105 | 89 | 106 |

TABLE 3-continued

| No. of test | The invention | The comparative | Standard |
|---|---|---|---|
| 11 | 105 | 84 | 106 |
| 12 | 105 | 83 | 106 |
| 13 | 104 | 93 | 106 |
| 14 | 104 | 97 | 106 |
| 15 | 103 | 85 | 107 |
| 16 | 105 | 97 | 106 |
| 17 | 105 | 84 | 107 |
| 18 | 105 | 93 | 105 |
| 19 | 104 | 85 | 106 |
| 20 | 104 | 97 | 104 |
| $\overline{X}$ | 104.8 | 87.8 | 106.3 |
| S | 0.76 | 5.6 | 0.79 |
| min. | 103 | 81 | 105 |
| max. | 106 | 97 | 108 |

As shown from the analytic data described in table 3, |Z|—f values of this invention and the comparative measured in 104.8 and 87.8, respectively, and the standard value of the filter which does not coated meased in 106.3. The differences of the standard deviation of this invention and the comparative are remarkable. Accordingly, as the results of analyzing, it was more concretely confirmed that the filter of this invention has a higher impedance. As shown in table 3, the mean deviations of this invention, the comparative and the standard also measured in 0.76, 5.6 and 0.79, respectively. Accordingly, it was also confirmed that the filter of this invention has a high quality.

This invention provides the filter having a high impedance and a small size. When the filter according to this invention was applied to the printed circuit board, it is of great advantages to decrease the number of the filter, to take a small area for the unit area per filter, to be realized by an unmanned automatization in preparing, to be workable for the mass production, to have quite sufficient the competitive power and, to reproduce the prefilter by collecting the inferior goods and removing the coating layer by treating with a chemical agent and the like.

What is claimed is:

1. An EMI bead core filter comprising a ferrite core having a hole, a lead wire received in said hole and having a bending portion on an upper surface of the core and a coating layer including an epoxy powder deposited on the upper surface of said core to adhere said core and said wire.

2. An EMI bead core filter as set forth in claim 1, wherein said epoxy powder includes Aluminium (Al) and Silicon (Si) as ingredients.

3. An EMI bead core filter as set forth in claim 1, wherein said epoxy powder consists of 47 weight % of Al, 48 weight % of Si and 5 weight % of Cl, Ag, Sb, Ti, Fe and Co.

* * * * *